United States Patent
Lee et al.

(10) Patent No.: US 10,121,660 B2
(45) Date of Patent: Nov. 6, 2018

(54) METHOD FOR FABRICATING SEMICONDUCTOR DEVICE

(71) Applicant: SAMSUNG ELECTRONICS CO., LTD., Suwon-si, Gyeonggi-do (KR)

(72) Inventors: So Young Lee, Yongin-si (KR); Hyun Su Kim, Suwon-si (KR); Jong Won Hong, Seoul (KR)

(73) Assignee: Samsung Electronics Co., Ltd., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/428,365

(22) Filed: Feb. 9, 2017

(65) Prior Publication Data

US 2018/0053687 A1  Feb. 22, 2018

(30) Foreign Application Priority Data

Aug. 18, 2016 (KR) .................. 10-2016-0104748

(51) Int. Cl.
| | |
|---|---|
| *H01L 21/033* | (2006.01) |
| *H01L 21/768* | (2006.01) |
| *H01L 23/528* | (2006.01) |
| *H01L 23/532* | (2006.01) |
| *H01L 21/311* | (2006.01) |
| *H01L 21/027* | (2006.01) |
| *H01L 23/544* | (2006.01) |

(Continued)

(52) U.S. Cl.
CPC ...... *H01L 21/0332* (2013.01); *H01L 21/0274* (2013.01); *H01L 21/0334* (2013.01); *H01L 21/0337* (2013.01); *H01L 21/3081* (2013.01); *H01L 21/3083* (2013.01); *H01L 21/31111* (2013.01); *H01L 21/7685* (2013.01); *H01L 21/76807* (2013.01); *H01L 21/76879* (2013.01); *H01L 21/76892* (2013.01); *H01L 23/5226* (2013.01); *H01L 23/5283* (2013.01); *H01L 23/53238* (2013.01); *H01L 23/544* (2013.01); *H01L 2223/54426* (2013.01)

(58) Field of Classification Search
CPC ......... H01L 23/544; H01L 2223/54426; H01L 21/0332; H01L 21/0334–21/0337; H01L 21/3081; H01L 21/3083; B81C 99/007
See application file for complete search history.

(56) References Cited

U.S. PATENT DOCUMENTS

| | | | | |
|---|---|---|---|---|
| 5,004,925 A | * | 4/1991 | Takahashi | ........... H01J 37/3045 250/491.1 |
| 5,968,847 A | | 10/1999 | Ye et al. | |
| 6,030,896 A | | 2/2000 | Brown | |

(Continued)

FOREIGN PATENT DOCUMENTS

| | | |
|---|---|---|
| JP | 2010-192503 | 9/2010 |
| KR | 10-2008-0061013 | 7/2008 |
| KR | 10-2010-0079179 | 7/2010 |

*Primary Examiner* — Julio J Maldonado
*Assistant Examiner* — Evan Clinton
(74) *Attorney, Agent, or Firm* — Lee & Morse, P.C.

(57) ABSTRACT

A method of fabricating a semiconductor device includes forming a metal film including Cu on a substrate, forming a protective film on the metal film, forming a hard mask including $TaO_x$, where x is 2.0 to 2.5, on the protective film, forming a hard mask pattern by patterning the hard mask, and forming a metal wiring by patterning the metal film, using the hard mask pattern as an etching mask.

19 Claims, 17 Drawing Sheets

(51) Int. Cl.
    *H01L 23/522*     (2006.01)
    *H01L 21/308*     (2006.01)

(56) References Cited

U.S. PATENT DOCUMENTS

| | | | |
|---|---|---|---|
| 6,194,323 | B1 | 2/2001 | Downey et al. |
| 6,797,640 | B2 * | 9/2004 | Tesauro ............ H01L 21/32139 257/E21.314 |
| 7,169,663 | B2 | 1/2007 | Suzuki |
| 7,509,729 | B2 | 3/2009 | Allen et al. |
| 8,598,039 | B2 | 12/2013 | Wang et al. |
| 8,728,936 | B1 | 5/2014 | Lu et al. |
| 8,735,278 | B2 | 5/2014 | Lee et al. |
| 9,281,277 | B2 | 3/2016 | Baek et al. |
| 9,312,204 | B2 | 4/2016 | Clarke et al. |
| 2007/0009840 | A1 * | 1/2007 | Kim .................. H01L 21/0337 430/313 |
| 2009/0302302 | A1 | 12/2009 | Heo et al. |
| 2014/0021611 | A1 | 1/2014 | Lee et al. |
| 2014/0131872 | A1 | 5/2014 | Lu et al. |
| 2014/0197538 | A1 | 7/2014 | Lu et al. |
| 2015/0255718 | A1 | 9/2015 | Liu et al. |
| 2016/0056205 | A1 * | 2/2016 | Nakamura ............ H01L 27/228 257/252 |
| 2017/0351173 | A1 * | 12/2017 | Funabashi ............. G03F 7/0002 |

\* cited by examiner

| SAMPLE | TaO$_x$ | EXTINCTION COEFFICIENT(k) @633nm |
|---|---|---|
| SAMPLE 0 | x=0.0 | 2.054 |
| SAMPLE 1 | x=1.5 | 2.020 |
| SAMPLE 2 | x=2.0 | 1.205 |
| SAMPLE 3 | x=2.3 | 1.029 |
| SAMPLE 4 | x=2.5 | ~0 |

| SAMPLE | TaO$_x$ | DENSITY RATIO (d) | HARD MASK MINIMUM THICKNESS(t1) [Å] | ALIGNMENT THICKNESS(t2) @633nm [Å] |
|---|---|---|---|---|
| SAMPLE 0 | x=0.0 | 1.84 | 250 | 490 |
| SAMPLE 1 | x=1.5 | 1.20 | 380 | 500 |
| SAMPLE 2 | x=2.0 | 1.09 | 430 | 836 |
| SAMPLE 3 | x=2.3 | 1.04 | 440 | 980 |
| SAMPLE 4 | x=2.5 | 0.96 | 480 | ∞ |

METHOD FOR FABRICATING SEMICONDUCTOR DEVICE

CROSS-REFERENCE TO RELATED APPLICATION

Korean Patent Application No. 10-2016-0104748, filed on Aug. 18, 2016, in the Korean Intellectual Property Office, and entitled: "Method for Fabricating Semiconductor Device," is incorporated by reference herein in its entirety.

BACKGROUND

1. Field

Embodiments relate to a method for fabricating a semiconductor device.

2. Description of the Related Art

Due to the development in recent years of electronic techniques, along with rapid progression of down-scaling of semiconductor elements, high integration and low power consumption of semiconductor chip are desirable.

In order to cope with the needs of the high integration and low power consumption of the semiconductor elements, research to improve the specific resistance and resistance capacitance delay (RC delay) of the metal wiring has been actively conducted.

In addition to applying a dual damascene technique to a Cu wiring process, development of a technique for forming a wiring by etching Cu is in progress.

SUMMARY

Embodiments are directed to a method of fabricating a semiconductor device, including forming a metal film including Cu on a substrate, forming a protective film on the metal film, forming a hard mask including $TaO_x$, where x is 2.0 to 2.5, on the protective film, forming a hard mask pattern by patterning the hard mask, and forming a metal wiring by patterning the metal film, using the hard mask pattern as an etching mask.

Embodiments are further directed to a method of fabricating a semiconductor device, including forming a first interlayer insulating film and a first wiring embedded in the first interlayer insulating film, on a substrate, forming a metal film on the first interlayer insulating film and the first wiring, forming a first protective film on the metal film, forming a hard mask including at least one of $TaO_x$, where, x is 2.0 to 2.5, tungsten oxide, cobalt oxide, nickel oxide, platinum oxide, aluminum oxide, and titanium oxide on the first protective film, forming a hard mask pattern by patterning the hard mask, and aligning the hard mask pattern to overlap on the first wiring, using a light source having a wavelength of 500 nm to 700 nm, and forming a second wiring electrically coupled to the first wiring, by patterning the metal film using the hard mask pattern as an etching mask.

Embodiments are further directed to a method of fabricating a semiconductor device including providing a substrate having an alignment key including a metal formed therein, forming a metal film on the substrate and covering the alignment key, the metal film including a same metal as the alignment key, forming a protective film on the metal film, forming a hard mask on the protective film such that a ratio of a thickness of the hard mask to a thickness of the metal film is 1.0 or more, the hard mask including at least one of tantalum oxide, tungsten oxide, cobalt oxide, nickel oxide, platinum oxide, aluminum oxide, and titanium oxide, wherein a content of oxygen in the at least one of tantalum oxide, tungsten oxide, cobalt oxide, nickel oxide, platinum oxide, aluminum oxide, and titanium oxide is selected to provide an extinction coefficient value (k) of the hard mask such that the alignment key is detectable with a light source having a wavelength of 500 nm to 700 nm and such that a density ratio (d) of the hard mask with respect to the metal of the metal film is 1 or greater, forming a photomask on the hard mask, detecting the alignment key using the light source having the wavelength of 500 nm to 700 nm, and patterning the photomask based on a detected position of the alignment key to form a photomask pattern, etching the hard mask using the photomask pattern as an etching mask to form a hard mask pattern, and patterning the metal film, using the hard mask pattern as an etching mask

BRIEF DESCRIPTION OF THE DRAWINGS

Features will become apparent to those of ordinary skill in the art by describing in detail exemplary embodiments with reference to the attached drawings in which:

FIGS. 11A to 15A illustrate intermediate stages of the method of fabricating the semiconductor device according to embodiments.

FIGS. 11B to 15B illustrate cross-sectional views taken along a line A-A' of FIG. 11A to FIG. 15A.

FIGS. 16A to 18A illustrate intermediate stages of the method of fabricating the semiconductor device according to embodiments.

FIGS. 16B to 18B illustrate cross-sectional views taken along the line B-B' of FIGS. 16A to 18A.

FIGS. 19A to 22A illustrate intermediate stages of a method os fabricating a semiconductor device according to embodiments.

FIGS. 19B to 22B illustrate cross-sectional views taken along the line C-C' of FIGS. 19a to 22a.

DETAILED DESCRIPTION

Figure 1:
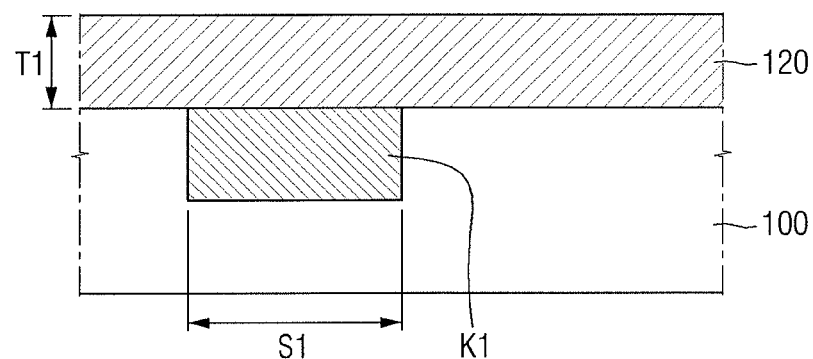
FIGS. 1 to 7 illustrate intermediate stages of a method of fabricating a semiconductor device according to embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Hereinafter, a method of fabricating a semiconductor device according to some embodiments of the technical idea of the present inventive concept will be described with reference to FIGS. 1 to 7.

FIGS. 1 to 7 illustrate intermediate stage diagrams for explaining a method of fabricating a semiconductor device according to embodiments.

Referring to FIG. 1, a substrate 100 may be provided. A metal film 120 may be formed on the substrate 100.

In some embodiments, an alignment key K1 may be formed below the metal film 120. For example, the alignment key K1 may be embedded within the substrate 100 and may be disposed below the metal film 120.

The substrate 100 may be, for example, a structure in which a base substrate and an epitaxial layer are laminated. The substrate 100 may be a silicon substrate, a gallium arsenide substrate, a silicon germanium substrate, a ceramic substrate, a quartz substrate or a display glass substrate. In some implementations, the substrate 100 may be a SOI (Semiconductor On Insulator substrate). In some examples hereinafter, the substrate 100 may be a silicon substrate. The substrate 100 may be, for example, in a form in which the insulating film is on the silicon substrate.

The metal film 120 may be formed, using, for example, a vapor deposition process to substantially uniformly cover the substrate 100 with the metal film 120. The metal film 120 may be formed to a first thickness T1. The metal film 120 may include, for example, Cu.

The type of metal included in the metal film 120 and the alignment key K1 may be variously selected. The alignment key K1 may include, for example, the same metal as the metal film 120. For example, when the metal film 120 includes Cu, the alignment key K1 may also include Cu.

Figure 2:
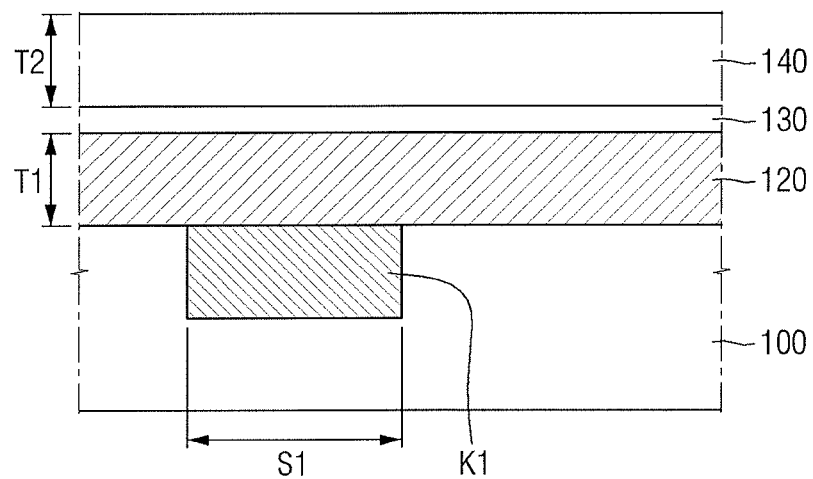

Referring to FIG. 2, a protective film 130 (capping) and a hard mask 140 may be sequentially formed on the metal film 120.

The protective film 130 may be formed on the metal film 120 using chemical vapor deposition (CVD) or the like. Forming the protective film 130 between the metal film 120 and the hard mask 140 may prevent the metal film 120 including Cu from being oxidized during subsequent processes. When the metal film 120 is Cu, the protective film 130 may be, for example, a silicon nitride or silicon carbonitride. The protective film 130 may include other substances that help prevent the metal film 120 from being oxidized during the process.

The hard mask 140 may be formed on the protective film 130 using physical vapor deposition (PVD) or the like. The hard mask 140 may be formed to a second thickness T2.

In some embodiments, the hard mask 140 may include $TaO_x$, where x is 2.0 to 2.5. The ratio of the second thickness T2 to the first thickness T1 may be 1.0 or more. The hard mask 140 will be described in detail in the description of FIGS. 8 to 10.

In some embodiments, the hard mask 140 may include $TaO_x$ where x is 2.5. In this case, the ratio of the second thickness T2 to the first thickness T1 may be 1.1 or more. Such a hard mask 140 will also be described in detail in the description of FIGS. 8 to 10.

Figure 3:
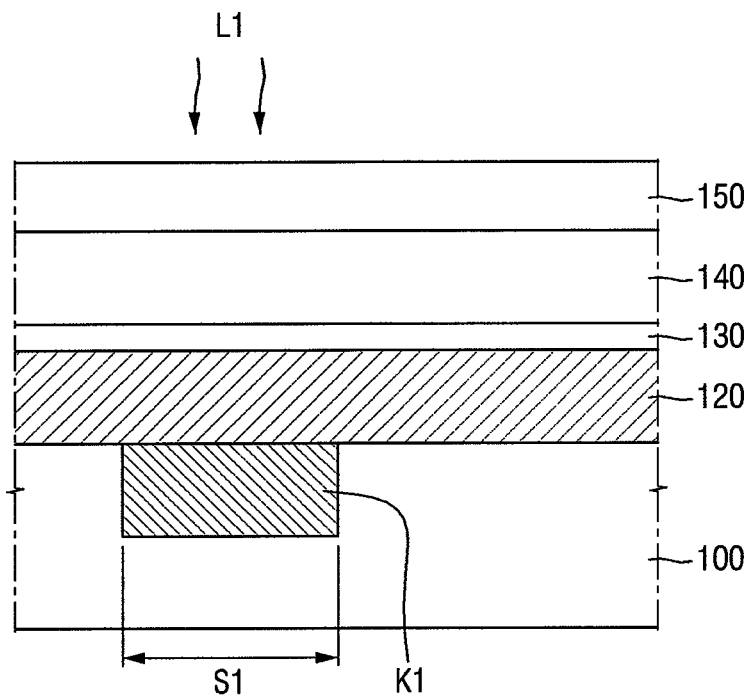
Figure 4:
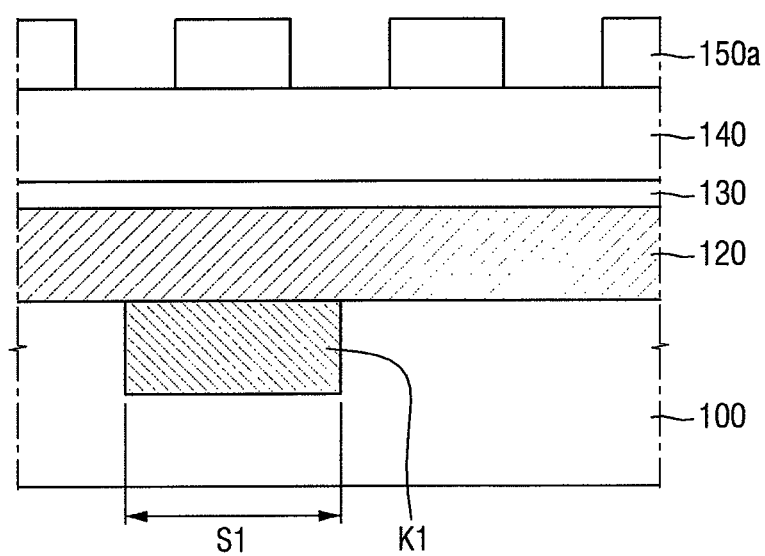

Referring to FIG. 3 and FIG. 4, a photomask 150 may be formed on the hard mask 140. Next, a photomask pattern 150a may be formed by exposing and developing the photomask 150.

In some embodiments, the photomask pattern 150a may be formed by being aligned at a specific position. For example, an aligner such as a stepper may be formed by detecting the alignment key K1 using a light source having a wavelength of 500 nm to 900 nm prior to the exposure and development of the photomask 150, and by aligning the photomask pattern 150a at a specific position based on the detected alignment key K1.

In some embodiments, the detection of the alignment key K1 may be performed using a first light source L1 having a wavelength of 500 nm to 700 nm. For example, the first light source L1 may detect the alignment key K1 by penetrating the hard mask 140 and the protective film 130 to identify a difference in thickness of the metal portion. The first light source L1 may detect the position of the alignment key K1 by identifying the portion in which the alignment key K1 and the metal film 120 overlap each other. The alignment key K1 may have a first length S1. Detection of the alignment key K1 may include detection of the alignment key K1 by recognizing the first length S1 through the aligner.

The photomask 150 may include an organic material including carbon. For example, the photomask 150, for example, may include a bottom anti-reflective coating (BARC).

The exposure apparatus for forming the photomask pattern 150a may form the photomask pattern 150a at a desired location, based on the detected alignment key K1. The exposure apparatus may be an apparatus such as an aligner, but in some implementations, may also include an apparatus different from the aligner.

Figure 5:
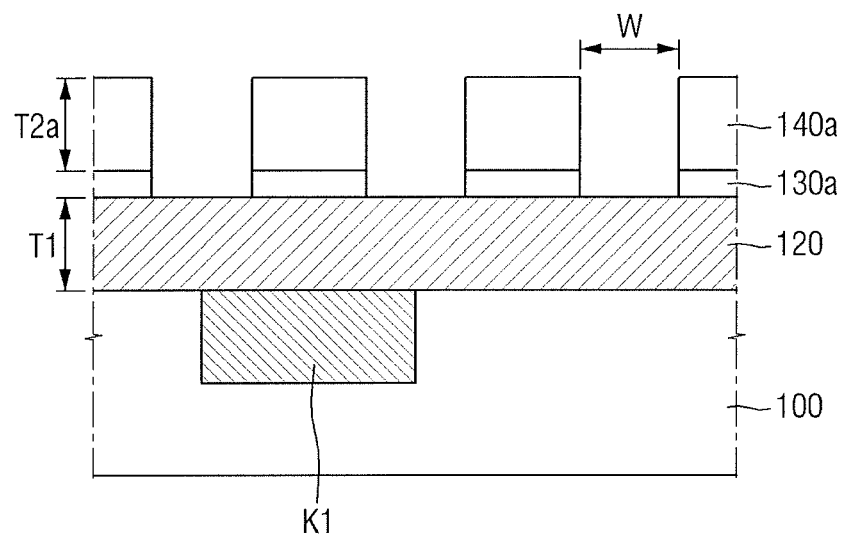

Referring to FIG. 5, a hard mask pattern 140a may be formed by patterning the hard mask 140.

In some embodiments, the hard mask pattern 140a may be formed by etching the hard mask 140 using the photomask pattern 150a as an etching mask (see, for example, FIGS. 3 and 4), and by removing the photomask pattern 150a. In some implementations, the protective film pattern 130a may be formed by simultaneously patterning the protective film 130 when forming the hard mask 140. In some implementations, the protective film pattern 130a may be formed by simultaneously patterning the protective film 130 when subsequently patterning the metal film 120.

Figure 6:
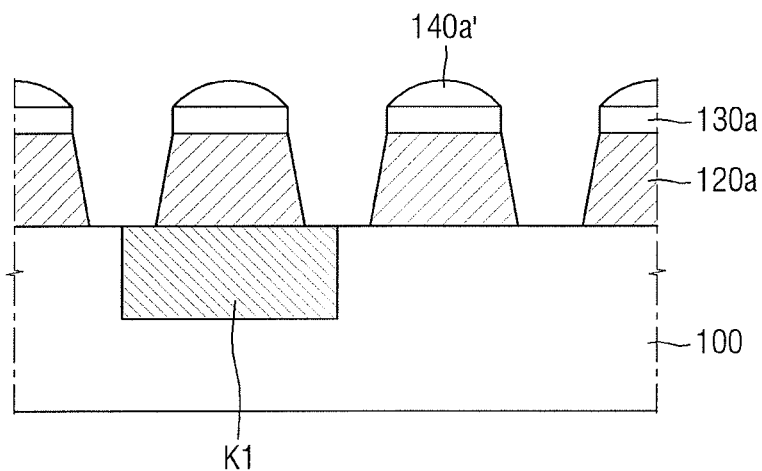

Referring to FIG. 6, the metal wiring 120a may be formed by patterning the metal film 120 using the hard mask pattern 140a formed in FIG. 5 as an etching mask.

In some embodiments, patterning the metal film 120 may include, for example, dry etching the metal film 120. For example, patterning the metal film 120 may include sputter etching the metal film 120.

A hard mask pattern debris 140a' may be exhausted in the course of etching. A thickness of the hard mask pattern debris 140a' may be less than a thickness of the hard mask pattern 140. The top of the hard mask pattern debris 140a' may be in a form of a parabola. A by-product of the hard mask pattern 140a of FIG. 5 generated in the course of etching may impede the patterning of the metal film. Thus, the metal wiring 120a may have a tapered cross-sectional shape in which the width increases toward the bottom from the top.

Figures 7, 8:
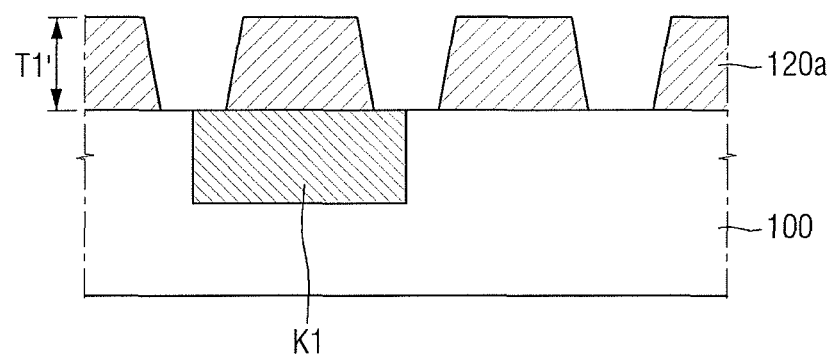
FIGS. 8 to 10 illustrate diagrams of characteristics of the hard mask including $TaO_x$, (wherein, x is 2.0 to 2.5) according to embodiments.

Referring to FIG. 7, the hard mask pattern debris 140a' may be removed.

Removing the hard mask pattern debris 140a' may include, for example, performing an ashing process. Removing the hard mask pattern debris 140a' may include, for example, using a chlorine-based gas and/or a fluorine-based gas.

The metal wiring 120a thus formed may be, for example, a contact wiring or the like, a gate electrode of a transistor, a source/drain of the transistor, a diode or the like.

Hereinafter, the reasons for using $TaO_x$, where, x is 2.0 to 2.5, as the hard mask 140 substance will be described with reference to FIGS. 1 to 10.

Figures 9, 10:
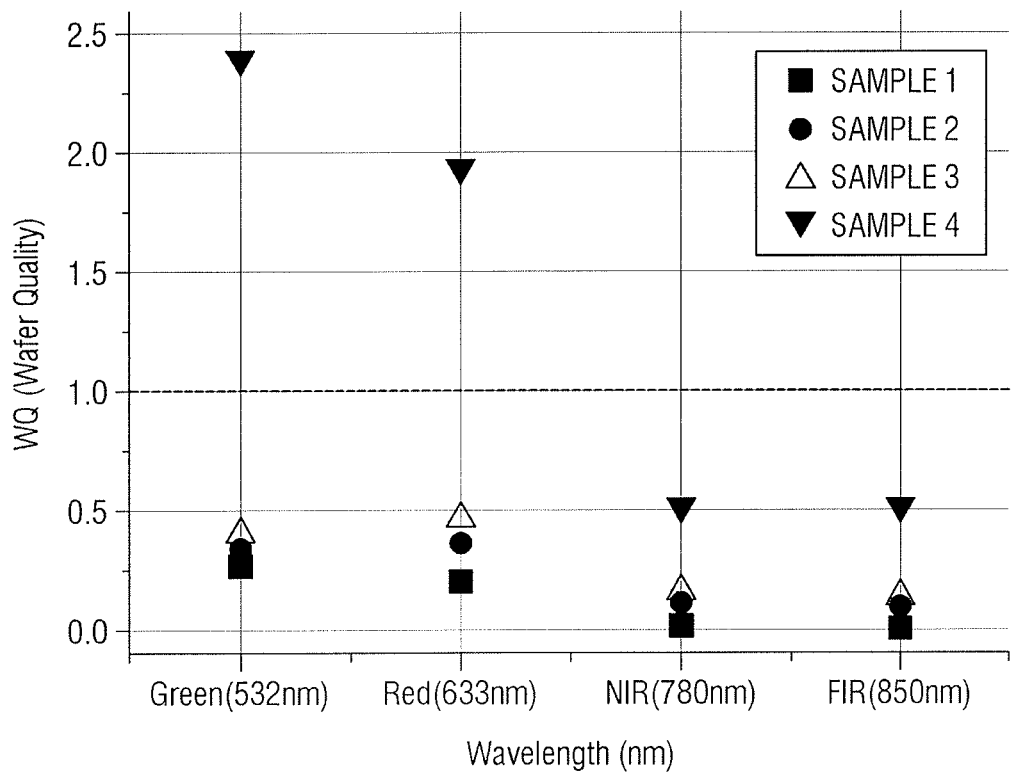

FIGS. 8 to 10 illustrate diagrams describing characteristics of the hard mask including $TaO_x$, where x is 2.0 to 2.5.

In forming the metal wiring (e.g., Cu wiring), for example, a damascene process may be used. In such a damascene process, an electro-chemical plating (ECP)

method could be used, but chemical impurities introduced in the process, and high crystallinity in the grain boundary could act as factors that increase the specific resistance and the RC delay.

Further, the high specific resistance and the RC delay could become more significant factors as the design rule decreases. In contrast, a method of forming the wiring by etching the metal may form the wiring without using an electrolytic plating method. Accordingly, an inflow of chemical impurities to the metal wiring or high crystallinity in the grain boundary may be prevented or avoided. It may be possible to form a metal wiring that improves the specific resistance and the RC delay.

As the hard mask substance for forming the wiring by etching the metal, tantalum (Ta), tungsten (W), cobalt (Co), nickel (Ni), platinum (Pt), aluminum (Al), titanium (Ti), or the like, having a relatively larger etching resistance than the metal used for wiring, could be used. However, in the process of exposing and etching the metal using an opaque layer such as Ta and W as a hard mask substance, there is a possibility that an upper metal wiring and a lower metal wiring might not be aligned in the exposure process for fabricating a multilayer metal wiring. Here, the term 'alignment' refers to a process of precisely overlapping the lower mask pattern and the upper mask pattern in the stepper or the like, to help prevent a phenomenon in which the upper metal wiring and the lower metal wiring are not electrically coupled in the multilayer metal wiring process. For example, as discussed above in the description of FIG. 3 and FIG. 4, the aligner such as a stepper may be formed by detecting the alignment key with a light source having a particular wavelength and aligning the metal wiring at a particular position based on the detected alignment key.

However, pure Ta, W, or the like, has relatively high extinction coefficient (k) of 2.054 and 2.92 with respect to a light source having a wavelength of 633 nm Thus, if pure Ta, W or the like, were used as a hard mask substance, the transmittance could be low and the alignment might not be easy.

In contrast, if a material such as TEOS (tetraethyl orthosilicate) having a low extinction coefficient (k) were used as a hard mask substance, the alignment may be easy. However, the etching resistance may be small, and patterning of metal film might not be easy due to generation of a large amount of by-products. For example, when using the TEOS having a low etching resistance as a hard mask substance, the hard masks may become exhausted in the process of patterning the metal film, and the top of the metal film may be damaged. Further, when forming a thick hard mask to prevent exhaustion of the hard mask (e.g., when the thickness of the TEOS is 1,500 Å or more), patterning of the metal film might be impeded by the by-products of the hard mask, and thus, the metal wiring might not be electrically separated.

Accordingly, the method of fabricating the semiconductor device according to embodiments may use a hard mask including $TaO_x$, where, x is 2.0 to 2.5, having a high etching resistance and excellent transmittance, by oxidizing Ta and adjusting the proportion (x) of O (oxygen) in $TaO_x$.

FIG. 8 illustrates a test data obtained by measuring the extinction coefficient (k) of $TaO_x$ in five samples (sample 0 to sample 4) having various values of x in $TaO_x$, with respect to a light source having a wavelength of 633 nm.

Referring to FIG. 8, in sample 1 (x=1.5), the extinction coefficient (k) is about 2.020, and there is no significant difference as compared to the extinction coefficient (k) 2.054 of pure Ta (i.e., sample 0, x=0.0). In contrast, in sample 2 (x=2.0) and sample 3 (x=2.3), the extinction coefficient (k) is about 1.205 and 1.029, respectively, which represents improvements by about half as compared to sample 1. In sample 4 (x=2.5), the extinction coefficient (k) is further improved, and may be close to zero.

The extinction coefficient (k) may be similarly improved with respect to other light sources having similar wavelengths, in addition to the light source having a wavelength of 633 nm. For example, if x is 2.0 or more, the extinction coefficient (k) of $TaO_x$ may be improved with respect to a light source having a wavelength of 700 nm from 500 nm. Thus, if x is 2.0 or more, a method of fabricating a semiconductor device according to embodiments may easily detect the alignment key with a light source having a wavelength of 500 nm to 700 nm.

FIG. 9 illustrates the density ratio (d) of Cu, a hard mask minimum thickness (t1) and an alignment thickness (t2) in the five samples (sample 0 to sample 4).

The density ratio (d) is test data obtained by measuring the density of the hard mask to the density of Cu, which may be used as an indicator for determining the etching resistance of the hard mask in dry etching. For example, when the density of the hard mask is similar to or greater than the density of Cu, it is possible to have a sufficient etching resistance. For example, if the density ratio (d) is about 1 or is larger than 1, the hard mask may have a sufficient etching resistance.

The hard mask minimum thickness (t1) in the test data represents the minimum thickness of the hard mask to prevent the top of the metal film from being damaged in the process of patterning. For example, as the density ratio (d) becomes greater, the hard mask minimum thickness t1 decreases.

The alignment thickness t2 is the maximum thickness of the hard mask that facilitates the detection of the alignment key. The alignment thickness t2 may be defined from the following formula 1. Here, symbol λ is a wavelength of the light source of aligner, and symbol k is an extinction coefficient of the hard mask.

$$t2 = \frac{\lambda}{2\pi k} \qquad \text{[Formula 1]}$$

When the hard mask is formed to be thicker than the alignment thickness t2, it may be difficult for an aligner to detect the alignment key.

Referring to FIG. 9, if x is 2.5 or less, the density ratio (d) is 0.96 or more. The density ratio (d) may be maintained at about 1 or to be greater than 1. Thus, if x is 2.5 or less, the hard mask may have a sufficient etching resistance.

However, as x increases, the etching resistance of $TaO_x$, may decrease. As described above, in the case of a hard mask having the low etching resistance, the hard mask may be formed to be thicker in order to prevent the top of the metal layer from being damaged. Referring to FIG. 9, in sample 2 and sample 3, the hard mask for etching Cu having a thickness of 430 Å may be formed to have a thickness of 430 Å, 440 Å, or more, respectively. In sample 4, the hard mask for etching Cu having a thickness of 430 Å may be formed be formed to have a thickness of 480 Å or more. For example, in some embodiments, when x is 2.0 or more, if the metal film includes Cu, the ratio of the thickness of the hard mask to the thickness of the metal film may be 1.0 or more.

When the thickness of the hard mask is increased, the intensity of the light source penetrating the hard mask may become weaker, and detection of the alignment key may become difficult. The intensity E of the light source penetrating the hard mask may be expressed by the following formula 2. Here, symbol $E_0$ is the intensity of the initial light source, and symbol t is the thickness of the hard mask.

$$E = E_0 \times \exp\left[-\frac{2\pi k}{\lambda} t\right] \quad \text{[Formula 2]}$$

The maximum thickness of the hard mask that facilitates the detection of the alignment key may be defined as the alignment thickness (t2), as illustrated in Formula 3 below.

$$t = t2 = \frac{\lambda}{2\pi k} \quad \text{[Formula 3]}$$

The alignment thickness (t2) is the thickness of the hard mask which sets the intensity E of the light source to $E_0/e$. When the thickness of the hard mask is formed to the alignment thickness t2 or less, the light source of the aligner may easily detect the alignment key by penetrating the hard mask. For example, referring to FIG. 9, when the hard mask is formed at an alignment thickness t2 of about 836 Å or less in sample 2, the light source of the aligner having the light source of 633 nm may easily detect the alignment key by penetrating the hard mask.

FIG. 10 illustrates the wafer quality (WQ) in each sample (samples 1 to 4 of FIG. 8) formed to a thickness of 500 Å with respect to light sources having various wavelengths (532 nm, 633 nm, 780 nm and 850 nm). The wafer quality (WQ) is an index that may be used as an indicator of the possibility that a particular light source is able to read the alignment key. For example, if the wafer quality (WQ) of a particular light source is 1 or more, the light source may easily detect the alignment key by penetrating the hard mask.

Referring to FIG. 10, the wafer quality (WQ) of sample 4 with respect to light sources having a wavelength 532 nm and 633 nm is 2.4 and 1.94. Accordingly, the alignment key may be easily detected in the light source. Thus, if x is 2.5, the method of fabricating a semiconductor device according to embodiments may easily detect the alignment key.

However, in sample 4, as described above, the hard mask for etching Cu with a thickness of 430 Å may be formed to have a thickness of 480 Å or more. For example, in some embodiments, when x is 2.5, if the metal film includes Cu, the ratio of the thickness of the hard mask to the thickness of the metal film may be 1.1 or more.

However, if the hard mask is excessively thickly formed, patterning of the metal film may be impeded by the by-products of the hard mask, and thus, portions of the metal wiring may not be electrically separated. Such a phenomenon may be further significantly considered as the design rule decreases. Referring to FIGS. 2 and 5, when the thickness T2a of the hard mask pattern 40a is maintained at the second thickness T2 of the hard mask 140, if the interval W between the hard mask patterns 140a is equal to or less than 45 nm, the ratio of the second thickness T2 of the hard mask 140 to the first thickness T1 of the metal film 120 may be desirably 1.5 or less.

The method of fabricating the semiconductor device according to embodiments may use tantalum oxide (TaO$_x$) as a hard mask substance. In some implementations, the method of fabricating the semiconductor device may use a hard mask that includes tungsten oxide, cobalt oxide, nickel oxide, platinum oxide, aluminum oxide, titanium oxide, or the like, having high etching resistance and excellent transmittance, by oxidizing tungsten (W), cobalt (Co), nickel (Ni), platinum (Pt), aluminum (Al), titanium (Ti), or the like, in a similar manner as oxidizing tantalum oxide, and by adjusting the proportion of O (oxygen). The proportion of O and the thickness of the hard mask may be determined in consideration of the density, the extinction coefficient, or the like, as with tantalum oxide. Hereinafter, the method of fabricating the semiconductor device according to embodiments will be described with reference to FIG. 11A to FIG. 15B.

FIGS. 11A to 15A illustrate intermediate stage diagrams explaining the method of fabricating the semiconductor device according to embodiments. FIGS. 11B to 15B illustrate cross-sectional views taken along a line A-A' of FIG. 11A to FIG. 15A. For convenience of explanation, repeated portions of the embodiments described with respect to FIGS. 1 to 9 will not be repeated or will be briefly described.

Figure 11A:
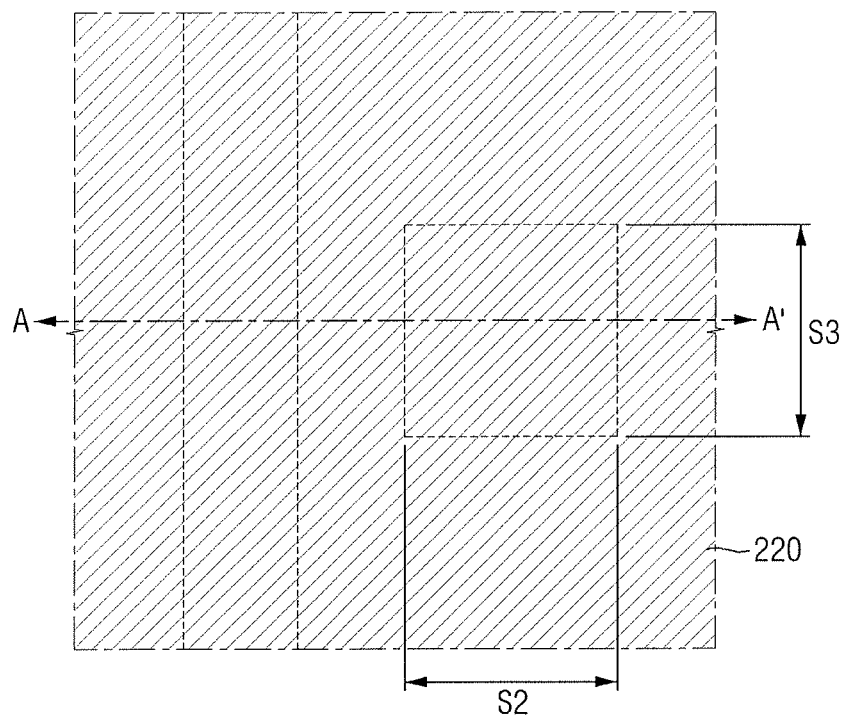
Figure 11B:
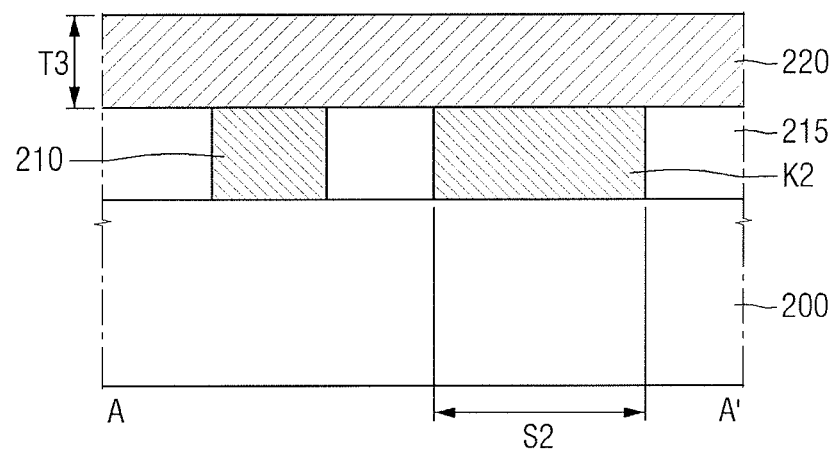

Referring to FIGS. 11A and 11B, a first interlayer insulation film 215 and a first wiring 210 may be formed on the substrate 200. Next, a metal film 220 may be formed on the first interlayer insulating film 215 and the first wiring 210.

In some embodiments, an alignment key K2 embedded in the first interlayer insulating film 215 may be further formed. The alignment key K2 may be disposed below the metal film 220.

The substrate 200 may be formed in the same manner as the substrate 100 as described with respect to FIGS. 1 to 7.

The first interlayer insulating film 215 may include, for example, at least one of a low dielectric constant material, an oxide film, a nitride film and an oxynitride film, in order to reduce a coupling phenomenon between wirings. The low dielectric constant material may include, for example, Flow-able Oxide (FOX), Tonen SilaZen (TOSZ), Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OSG), parylene, bis-benzocyclobutene (BCB), SILK, a polyimide, a porous polymeric material or a combination thereof.

The first wiring 210 may be formed so as to be embedded in the first interlayer insulating film 215. The first wiring 210 may be a metal wiring or a contact. The first wiring 210 may be a gate electrode of a transistor, a source/drain of the transistor, a diode or the like, as examples. The first wiring 210 may include at least one of Cu, Pt, Co and Ni.

The metal film 220 may be formed in the same manner as the metal layer 120 of FIGS. 1 to 7. However, in the present method, the metal film 220 may include at least one of Cu, Pt, Co and Ni. The metal film 220 may be formed at a third thickness T3.

FIGS. 11A and 11B illustrate the alignment key K2 that has a rectangular parallelepiped shape and is spaced apart from the first wiring 210. In some implementations, the alignment key K2 may have another shape such as a cylindrical shape and may be connected to the first wiring 210. The alignment key K2 may include a same metal as the first wiring 210, and may be simultaneously formed when forming the first wiring 210. The alignment key K2 may be formed to have a second length S2 in a direction intersecting with the direction of extension of the first wiring, and a third length S3 in the direction of extension of the first wiring.

Figure 12A:
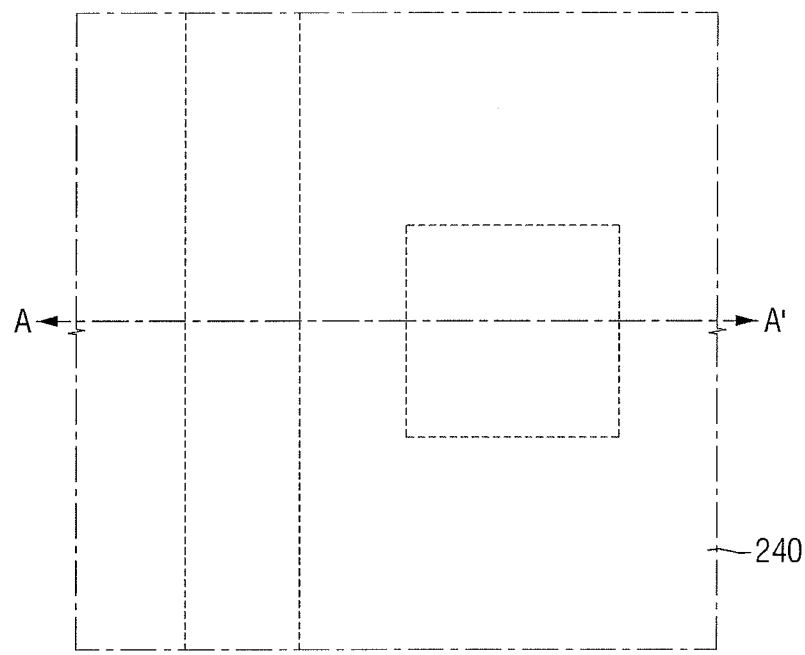
Figure 12B:
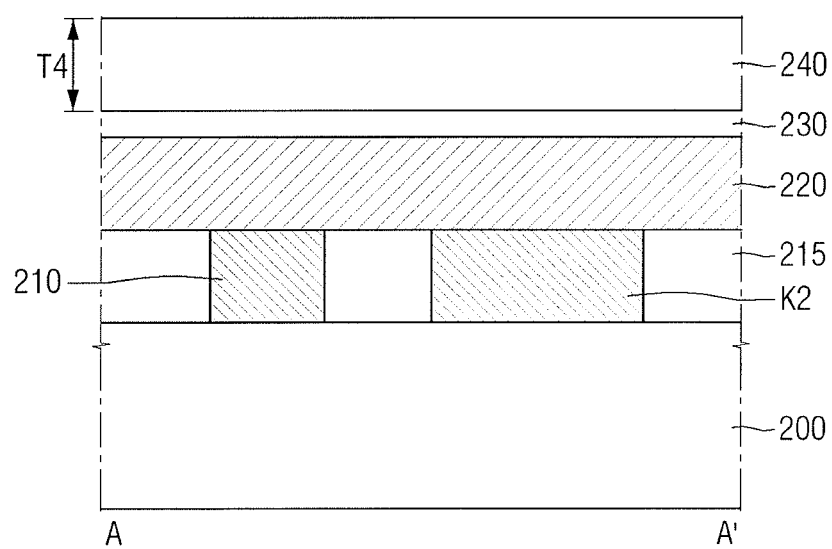

Referring to FIGS. 12A and 12B, the protective film 230 and the hard mask 240 may be sequentially formed on the metal film 220.

The protective film 230 and the hard mask 240 may be formed in the same manner as the protective film 130 and the hard mask 140 of FIG. 7 except that the hard mask 240 may be formed to a fourth thickness T4.

In some embodiments, the hard mask 240 may include at least one of tantalum oxide, tungsten oxide, cobalt oxide, nickel oxide, platinum oxide, aluminum oxide and titanium oxide. For example, the hard mask 240 may include $TaO_x$, where x is 2.0 to 2.5. The fourth thickness T4 of the hard mask may be equal to or less than the alignment thickness t2 as provided in FIG. 9. Such a hard mask 240 has been described in detail in FIGS. 8 to 10.

In some embodiments, the hard mask 240 may include $TaO_x$, where, x is 2.5. The ratio of the fourth thickness T4 to the third thickness T3 may be 1.1 or more. Such a hard mask 240 has been described in detail in the description of FIGS. 8 to 10.

Figure 13A:
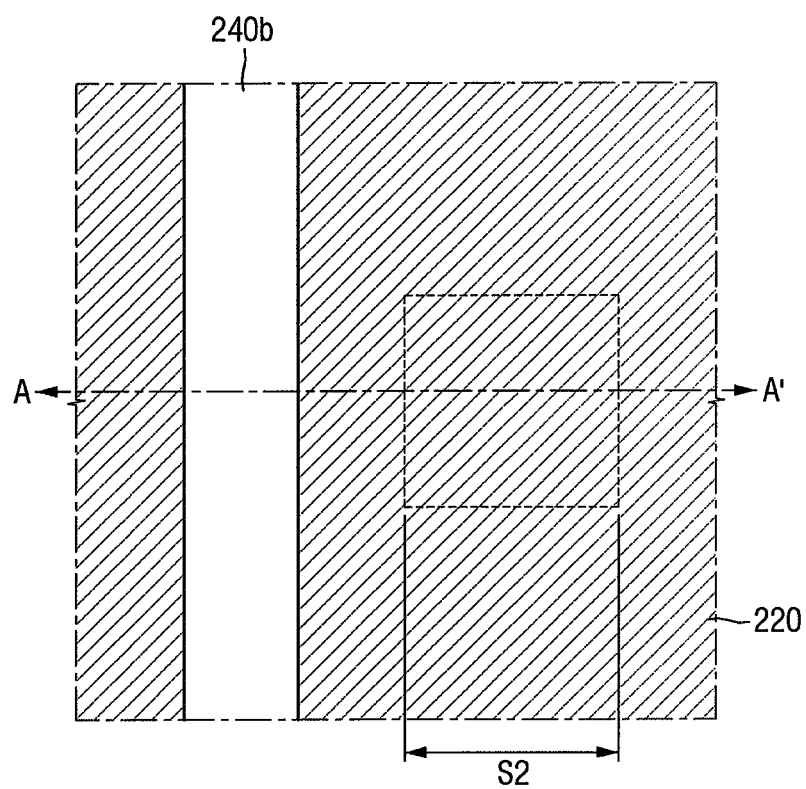
Figure 13B:
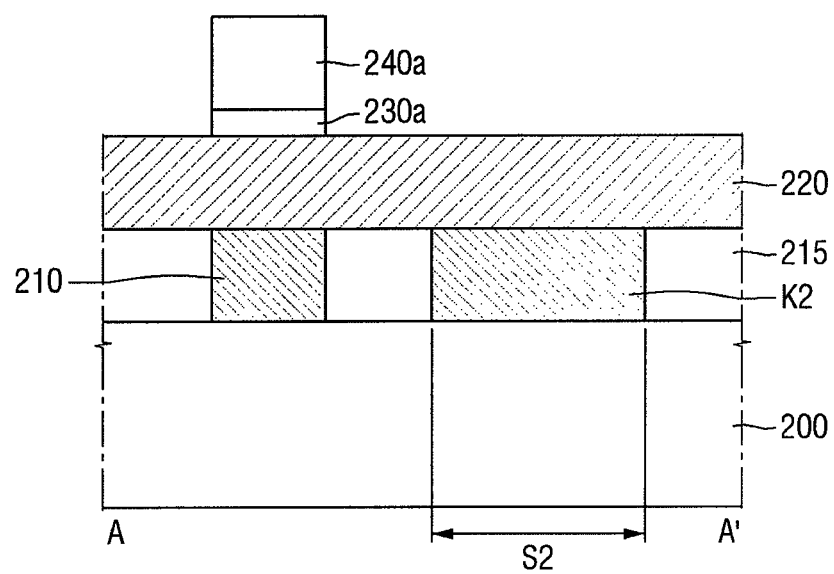

Referring to FIGS. 13A and 13B, a hard mask pattern 240a and a protective film pattern 230a may be formed by patterning the hard mask 240 and the protective film 230. At this time, it is possible to align and form the hard mask pattern 240a and the protective film pattern 230a at a specific position. Forming the hard mask pattern 240a may be the same as forming the hard mask pattern 140a and the protective film pattern 130a as illustrated in FIG. 5, using the photomask pattern 150a formed by being aligned as illustrated in FIG. 4 as an etching mask.

In some embodiments, the hard mask pattern 240a and the protective film pattern 230a may be formed by being aligned to overlap the first wiring 210. Detection of the alignment key K2 may include, for example, recognizing the second length S2 of the alignment key K2 using the aligner.

FIGS. 13A and 13B illustrate the single hard mask pattern 240a and the single protective film pattern 230a. When there is a plurality of first wirings 210, a plurality of hard mask patterns 240a and a plurality of protective film patterns 230a may also be formed. The hard mask pattern 240a and the protective film pattern 230a may be formed to overlap the alignment key K2 as well as the first wiring 210.

Figure 14A:
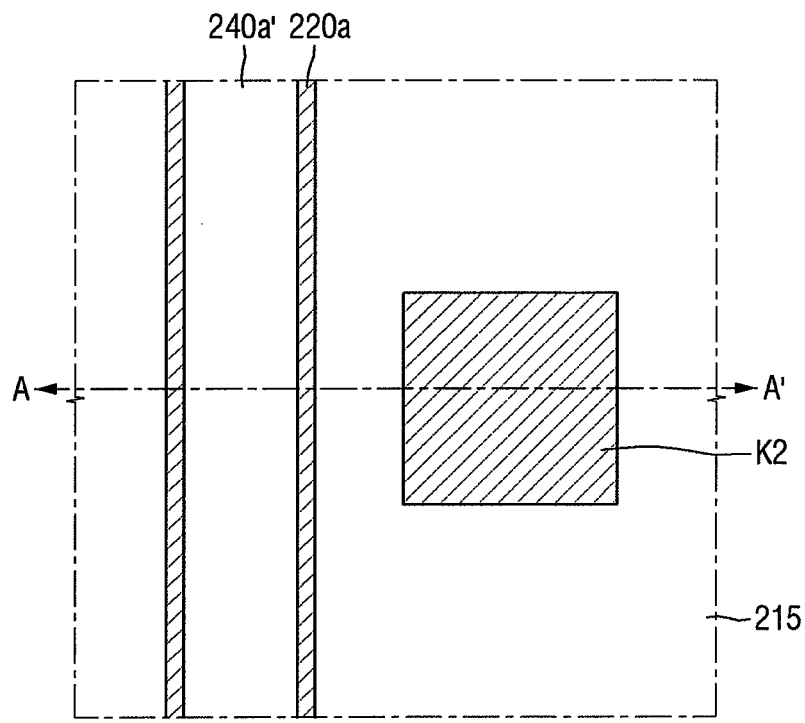
Figure 14B:
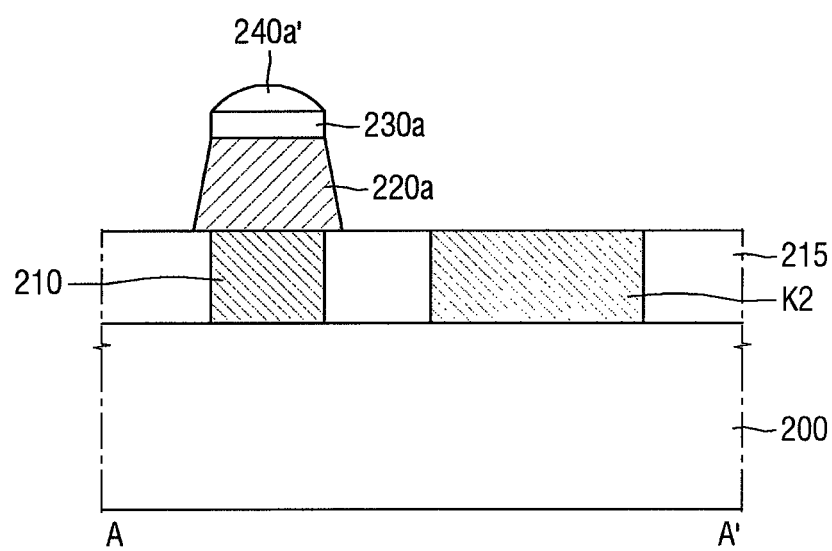

Referring to FIGS. 14A and 14B, a second wiring 220a may be formed by patterning the metal film 220 using the hard mask pattern 240a formed in FIGS. 13A and 13B as an etching mask.

Forming the second wiring 220a may be the same as forming the first wiring 120a as illustrated in FIG. 6. For example, the hard mask pattern debris 240a' may be exhausted in the course of etching. The thickness of the hard mask pattern debris 240' may be less than the thickness of the hard mask pattern 240a. The top of the hard mask pattern debris 240a' may be in a form of a parabola. The second wiring 220a may have a tapered cross-sectional form in which the width of the second wiring 220a increases in a direction toward the bottom from the top.

Figure 15A:
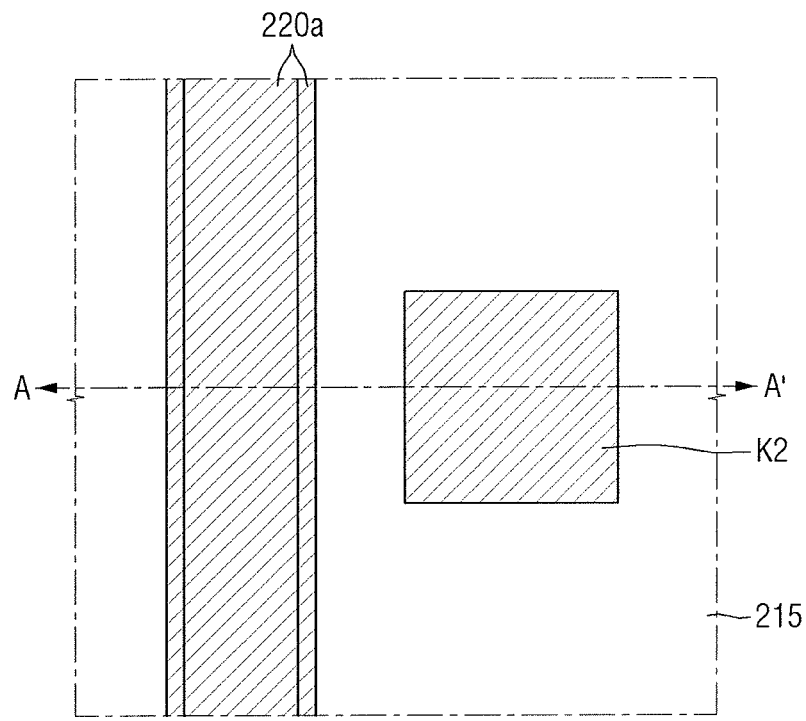
Figure 15B:
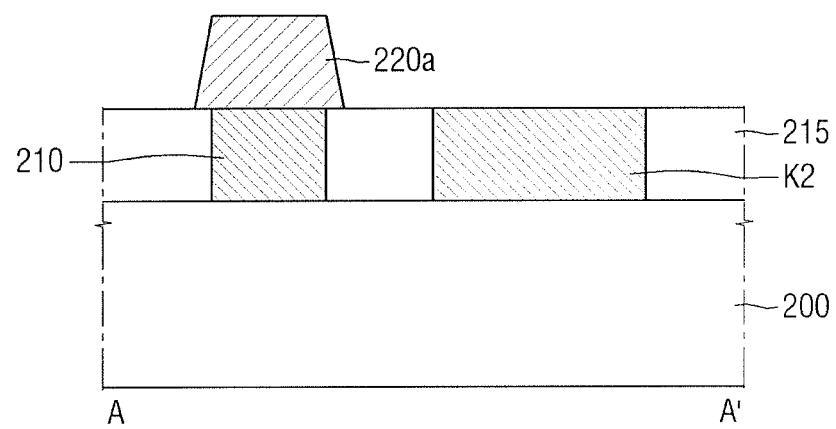

Referring to FIGS. 15A and 15B, the hard mask pattern debris 240a' and the protective film pattern 230a may be removed.

Removing hard mask pattern debris 240a' and the protective film pattern 230a may be carried out in the same manner as removing the hard mask pattern debris 140a' and the protective film pattern 130a illustrated in FIG. 7.

The second wiring 220a thus formed may be a contact of the wiring. The second wiring 220a may be a gate electrode of a transistor, a source/drain of the transistor, a diode, or the like, as examples.

Thus, the method of fabricating the semiconductor device according to embodiments may easily align the first wiring 210 and the second wiring 220a, using a hard mask having a high etching resistance and excellent transmittance. For example, the method of fabricating the semiconductor device according to embodiments may provide improved yield and reliability in the process for fabricating the multilayer metal wiring by etching the metal.

Hereinafter, the method of fabricating the semiconductor device according to embodiments will be described with reference to FIG. 16A to FIG. 18B.

FIGS. 16A to 18A illustrate intermediate stage diagrams depicting a method of fabricating the semiconductor device according to embodiments. FIGS. 16B to 18B illustrate cross-sectional views taken along the line B-B' of FIGS. 16A to 18A. For convenience of explanation, the repeated description of aspects described with reference to FIGS. 1 to 15B will not be repeated or will be briefly described.

Figure 16A:
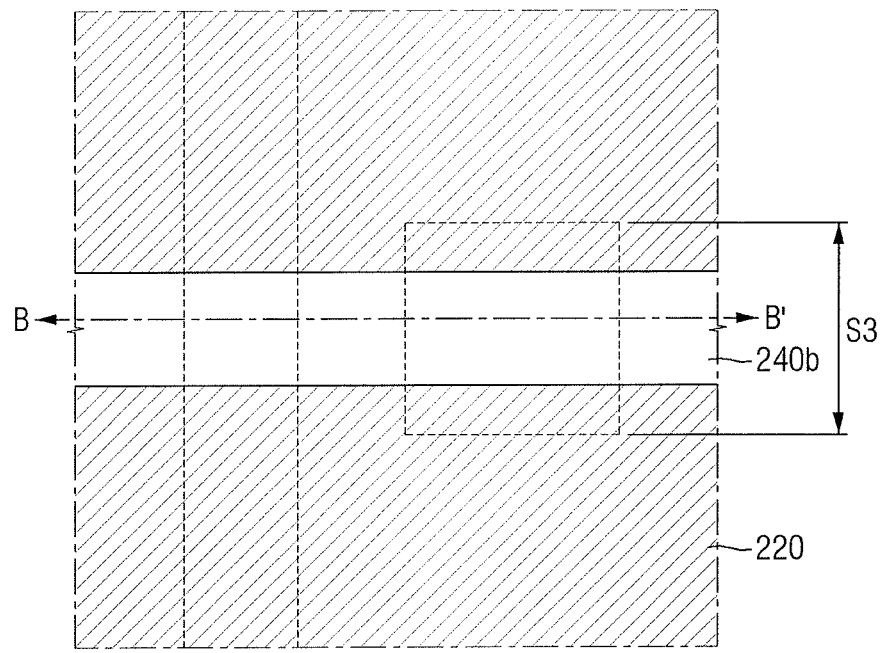
Figure 16B:
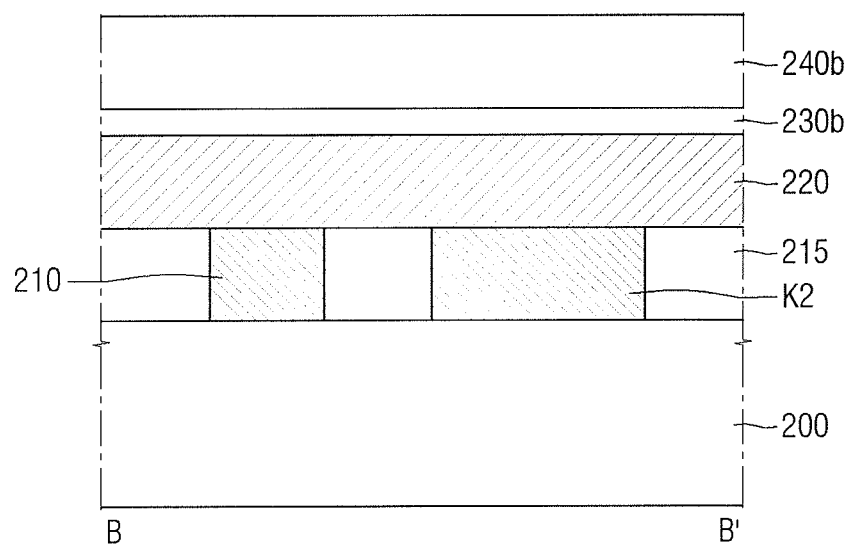

Referring to FIGS. 16A and 16B, a hard mask pattern 240b and a protective film pattern 230b may be formed by patterning the hard mask 240 and the protective film 230 as illustrated in FIGS. 12A and 12B. The hard mask pattern 240b and the protective film pattern 230b may be formed to be aligned at a specific position. Forming the hard mask pattern 240b may be carried out in the same manner as forming the hard mask pattern 140a and the protective film pattern 130a as illustrated in FIG. 5, using the photomask pattern 150a, formed by being aligned as illustrated in FIGS. 3 and 4, as an etching mask.

In some embodiments, the hard mask pattern 240b and the protective film pattern 230b may be formed to be aligned to intersect with the first wiring. The detection of the alignment key K2 may include, for example, detection of the alignment key K2, by recognizing the third lengths S3 through the aligner.

FIGS. 16A and 16B illustrate a single hard mask pattern 240b and a single protective film pattern 230b. In some implementations, when there is a plurality of first wirings 210, a plurality of hard mask patterns 240b and a plurality of protective film patterns 230b may also be formed. FIGS. 16A and 16B illustrate that the hard mask pattern 240b and the protective film pattern 230b overlap with the alignment key K2 and are orthogonal to the first wiring 210. In some implementations, the hard mask pattern 240b and the protective film pattern 230b may not overlap the alignment key K2 and may not be orthogonal to the first wiring 210.

Figure 17A:
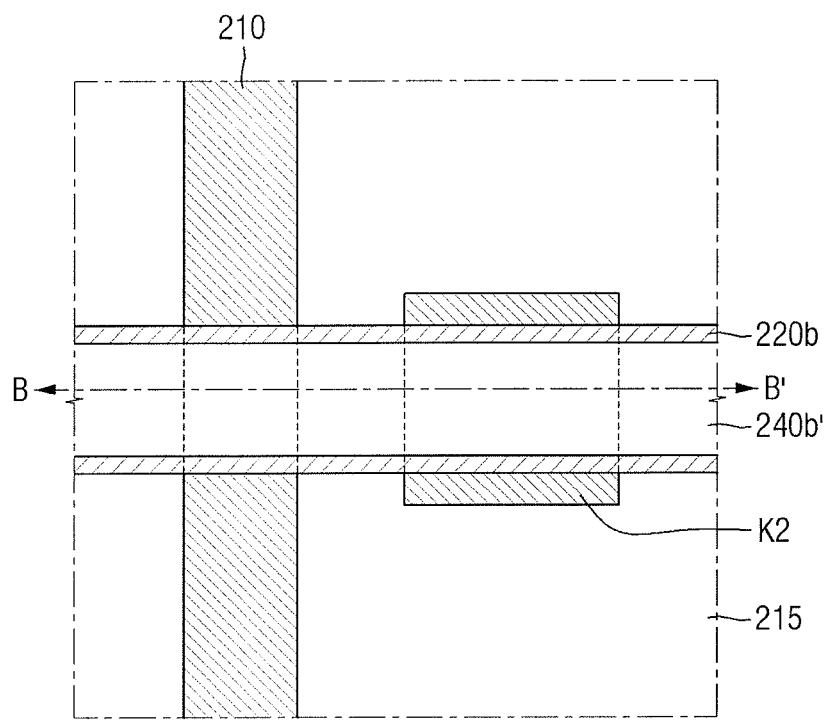
Figure 17B:
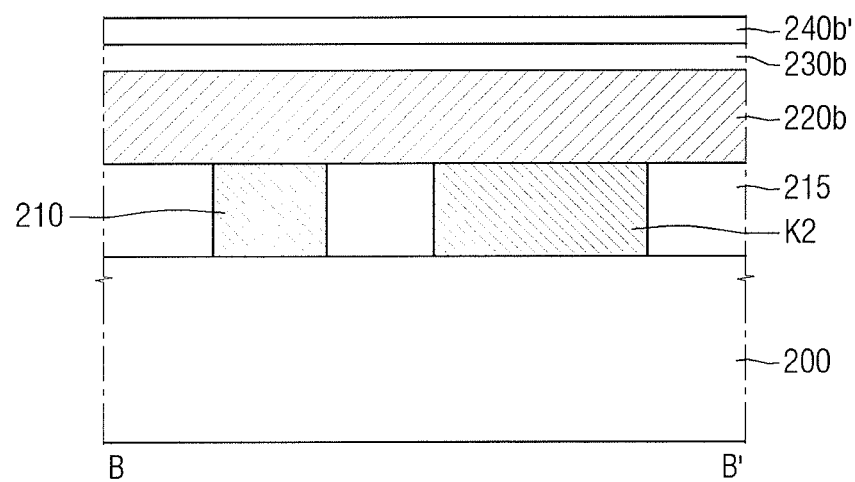

Referring to FIGS. 17A and 17B, a third wiring 220b may be formed by patterning the metal film 220, using the hard mask pattern 240b formed in FIGS. 16A and 16B as an etching mask.

Forming the third wiring 220b may be carried out in the same as forming the first wiring 120a, as illustrated FIG. 6. For example, the hard mask pattern debris 240b' may be exhausted in the course of etching. The thickness of the hard mask pattern debris 240b' may be less than a thickness of the hard mask pattern 240b. The top of the hard mask pattern debris 240b' may be in a form of a parabola. The third wiring 220b may have a tapered cross-sectional shape in which the width of the third wiring 220b increases in a direction toward the bottom from the top.

Figure 18A:
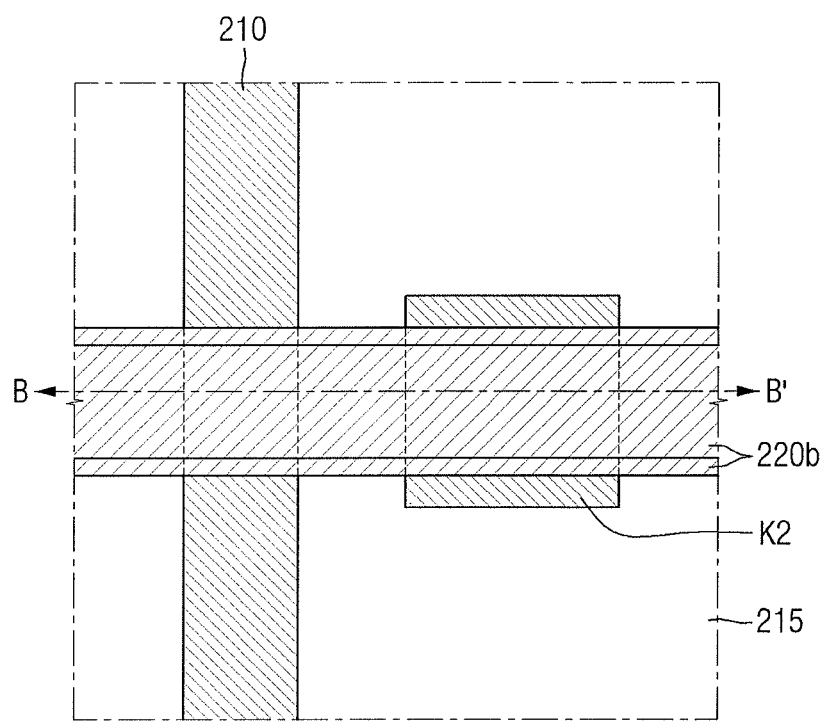
Figure 18B:
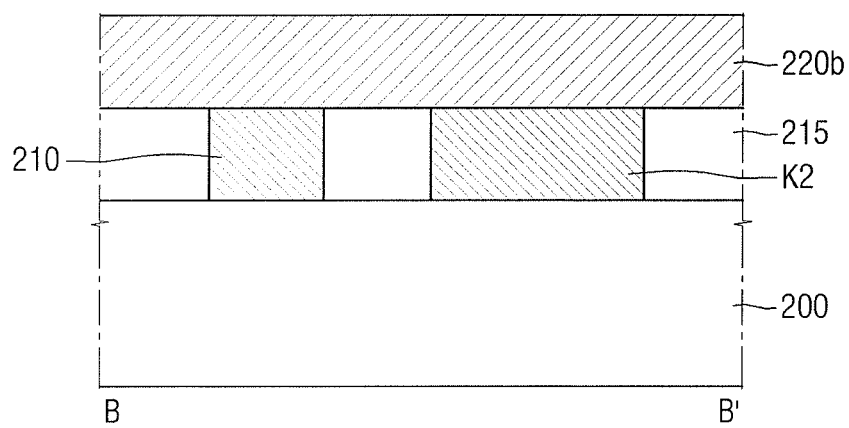

Referring to FIGS. 18A and 18B, the hard mask pattern debris 240b' and the protective film pattern 230b may be removed.

The third wiring 220b thus formed may be a contact of the wiring, or may be a gate electrode of a transistor, a source/drain of the transistor, a diode or the like, as examples.

Thus, the method of fabricating the semiconductor device according to embodiments may allow the first wiring 210 and the third wiring 220b to intersect with each other at a particular position, by using a hard mask having the high etching resistance and excellent transmittance. The method of fabricating the semiconductor device according to embodiments may provide a method of fabricating a semiconductor device in which the lower metal wiring and the upper metal wiring intersect with each other at a particular position according to the circuit design, in a process the multilayer metal wiring is fabricated by etching the metal.

Hereinafter, a method of fabricating a semiconductor device according to embodiments will be described with reference to FIG. 19A to FIG. 22B.

FIGS. 19A to 22A illustrate intermediate stage diagrams to explain a method of fabricating a semiconductor device according to embodiments. FIGS. 19B to 22B are cross-sectional views taken along the line C-C' of FIGS. 19A to 22A. For convenience of explanation, descriptions of portions of the embodiment described with reference to FIGS. 1 to 15B will not be repeated or will briefly described.

Figure 19A:
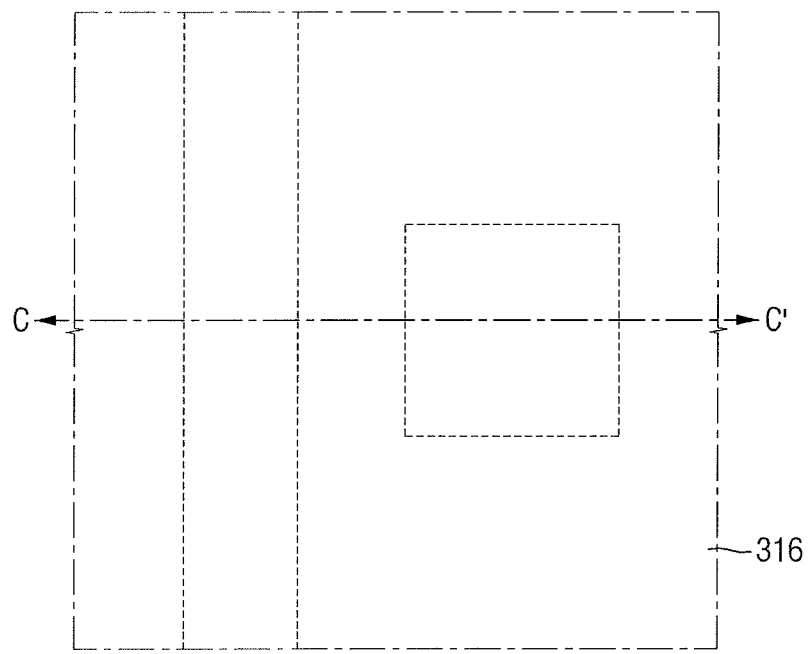
Figure 19B:
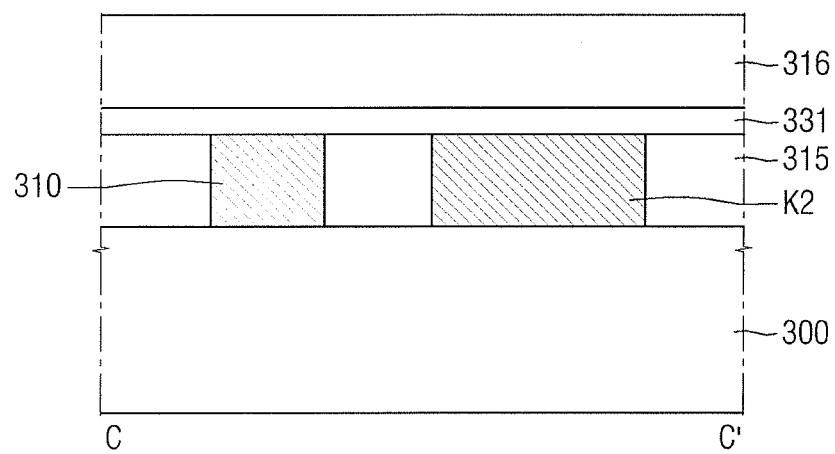

Referring to FIGS. 19A and 19B, a first interlayer insulation film 315 and a first wiring 310 may be formed on the substrate 300. Subsequently, a second protective film 331 and a second interlayer insulating film 316 may be sequentially formed on the first interlayer insulating film 315 and the first wiring 310.

In some embodiments, an alignment key K3 embedded in the first interlayer insulating film 315 may be formed. The alignment key K3 may be disposed below the second protective film 331.

The substrate 300 may be formed in the same manner as the substrate 100 illustrated in FIGS. 1 to 7.

The first interlayer insulating film 315 and the first wiring 310 may be formed in the same manner as the first interlayer insulating film 215 and the first wiring 210 illustrated in FIGS. 11A and 11B.

The alignment key K3 may be formed in the same manner as the alignment key K2 of the FIGS. 11A and 11B.

The second protective film 331 may be formed on the first interlayer insulating film 315 and the first wiring 310 by a chemical vapor deposition (CVD). The second protective film 331 formed over the first interlayer insulating film 315, the first wiring 310 and/or the alignment key K3 may prevent the metal material of the first wiring 310 and/or the alignment key K3 from being oxidized during subsequent processes. The second protective film 331 may include substances that help prevent the first wiring 310 or the alignment key K3 from being oxidized during the processes. For example, if the first wiring 310 and/or the alignment key K3 includes Cu, the second protective film 331 may include silicon nitride or silicon carbonitride.

The second interlayer insulating film 316 may include, for example, at least one of a low dielectric constant material, an oxide film, a nitride film and an oxynitride film in order to reduce a coupling phenomenon between the wirings. The low dielectric constant material may include, for example, Flowable Oxide (FOX), Tonen SilaZen (TOSZ), Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OSG), parylene, a bis-benzocyclobutene (BCB), SILK, a polyimide, a porous polymeric material or a combination thereof.

Figure 20A:
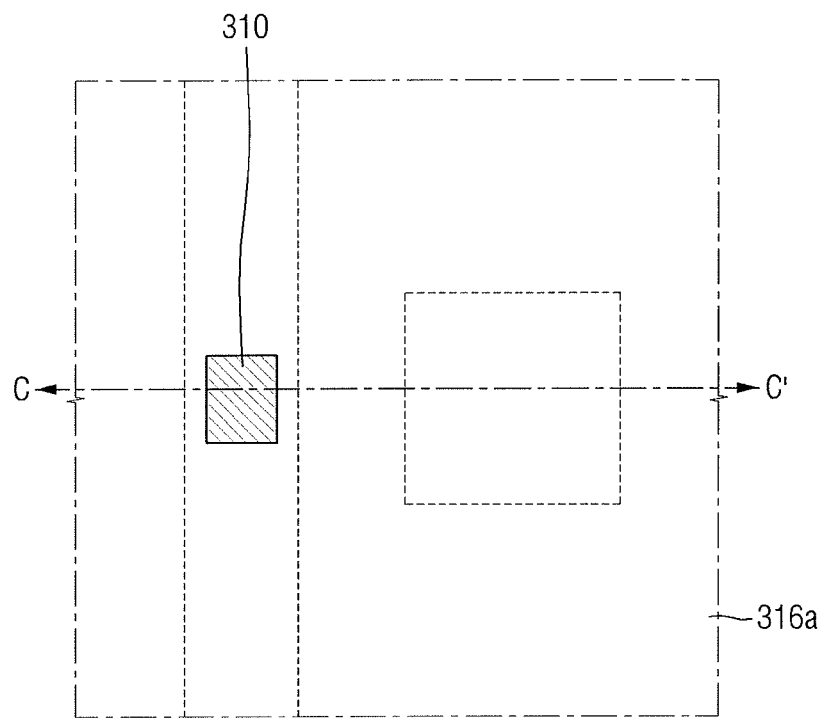
Figure 20B:
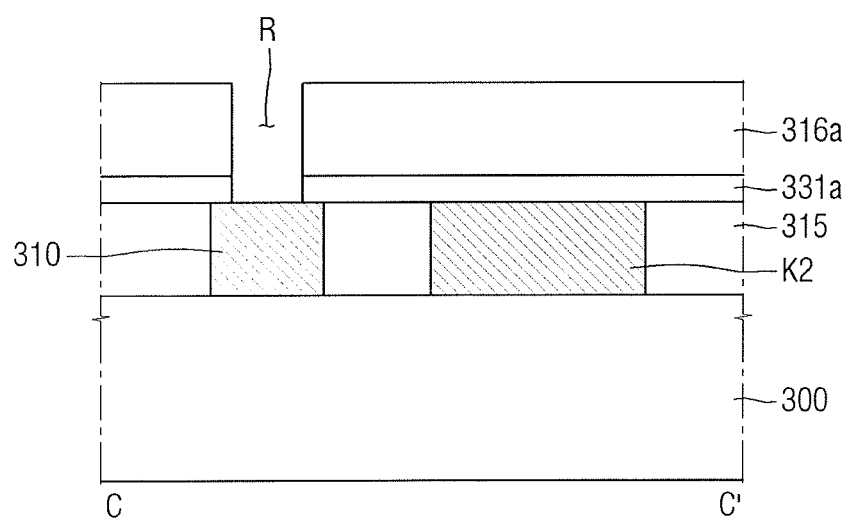

Referring to FIGS. 20A and 20B, the second protective film pattern 331a and the second interlayer insulating film pattern 316a may be formed by etching the second protective film 331 and the second interlayer insulating film 316. The second protective film 331 and the second interlayer insulating film 316 may be etched to form a recess R that exposes at least a part of the upper surface of the first wiring 310.

The recess R, for example, may be formed, for example, by a photolithography process.

FIGS. 20A and 20B illustrate a single recess R, as an example. When there is a plurality of first wirings 310, a plurality of recesses R may also be formed. Although the recess R is illustrated to expose at least a part of the upper surface of the first wiring 310, in some implementations, at least a part of the upper surface of the alignment key K3, as well as the upper surface of the first wiring 310, may also be exposed.

Figure 21A:
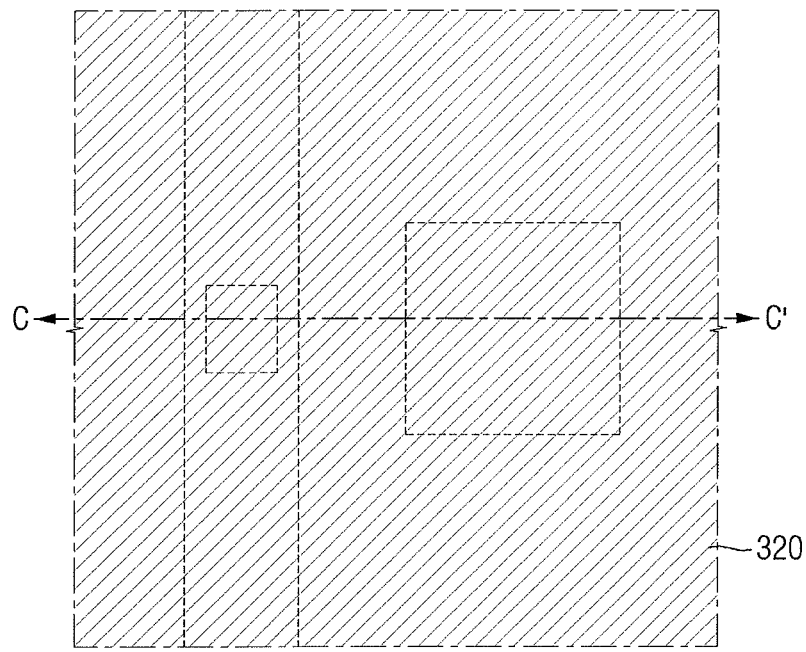
Figure 21B:
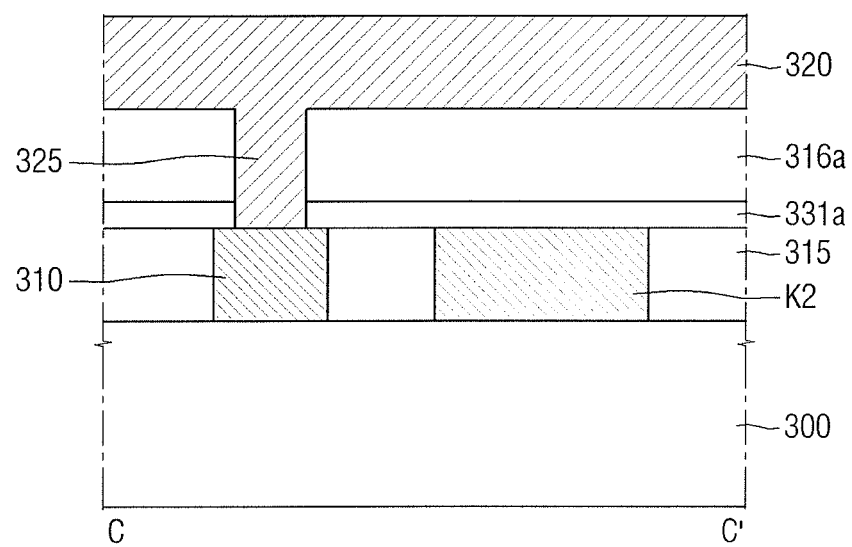

Referring to FIGS. 21A and 21B, the recess may be filled with a metal material to form a via 325, and the metal film 320 may be formed on the via 325 and the second protective film pattern 331a. The via may be formed to cover the upper surface of the first wiring 310, the side surface of the second protective film pattern 331a and the side surface of the second interlayer insulation film pattern 316a. The metal film 320 may be formed to cover the upper surface of the via 325 and the upper surface of the second interlayer insulation film pattern 316a.

The via 325 and the metal film 320 may be formed, for example, by a deposition process. The via 325 and the metal film 320 may include, for example, at least one of Cu, Pt, Co and Ni.

In some embodiments, forming the via 325 and forming the metal film 320 may be performed simultaneously. The via 325 and the metal film 320 may be formed of the same material.

Figure 22A:
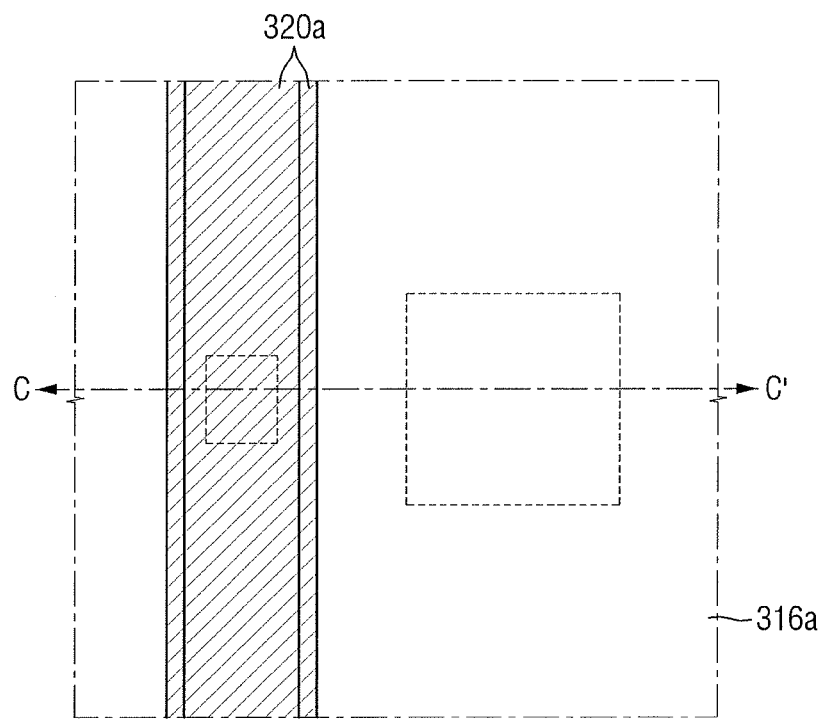
Figure 22B:
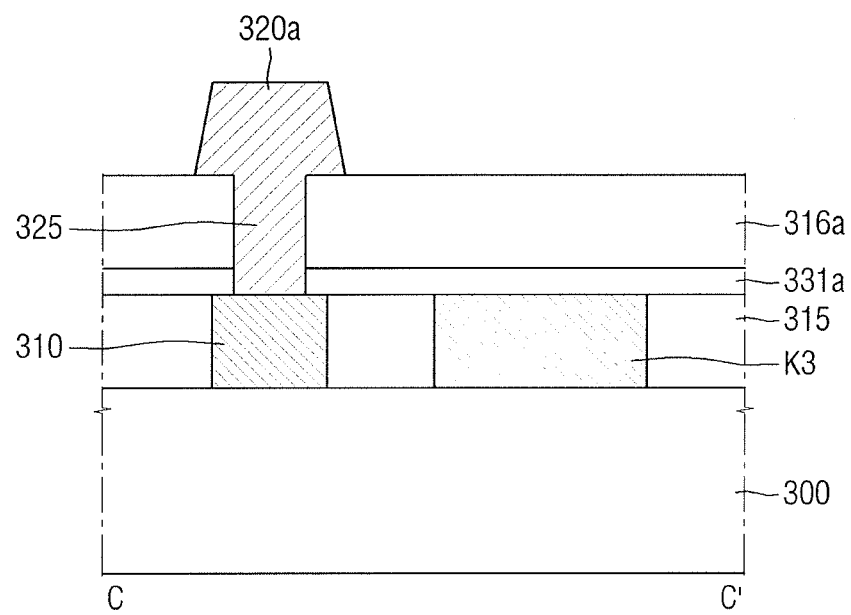

Referring to FIGS. 22A and 22B, a fourth wiring 320a may be formed by patterning the metal film 320.

The fourth wiring 320a may be forming in a similar manner as forming the first wiring 120a, as illustrated in FIG. 6. The fourth wiring 320a may have a tapered cross-sectional shape in which the width of the fourth wiring 320a increases in a direction toward the bottom from the top.

Thus, the method of fabricating the semiconductor device according to embodiments may easily align the first wiring 310, the via 325 and the fourth wiring 320a by utilizing the hard mask having the high etching resistance and excellent transmittance.

By way of summation and review, to provide high integration and low power consumption of semiconductor elements, research to improve the specific resistance and resistance capacitance delay (RC delay) of metal wiring has been actively conducted. In addition to applying a dual damascene technique to a Cu wiring process, development of a technique for forming a wiring by etching Cu is in progress.

Embodiments provide a method of fabricating a semiconductor device with improved yield and reliability in a process of fabricating a multilayer metal wiring by etching the metal.

Embodiments provide a method of fabricating a semiconductor device with improved yield and reliability, using a hard mask that is easily aligned Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method of fabricating a semiconductor device, the method comprising:
    forming a metal film including Cu on a substrate;
    forming a protective film on the metal film;
    forming a hard mask on the protective film, the hard mask including $TaO_x$, where x is 2.0 to 2.5, and a ratio of a thickness of the hard mask to a thickness of the metal film is 1.0 or more, wherein forming the hard mask includes forming the hard mask at an alignment thickness T or less, the alignment thickness T being expressed by the following formula:

$$T = \frac{\lambda}{2\pi k} \qquad <\text{Formula}>$$

where symbol $\lambda$ is a wavelength of the light source, and symbol k is an extinction coefficient of the hard mask;
    forming a hard mask pattern by patterning the hard mask; and
    forming a metal wiring by patterning the metal film, using the hard mask pattern as an etching mask.

2. The method as claimed in claim 1, wherein:
    the metal film is patterned by sputter etching the metal film.

3. The method as claimed in claim 2, wherein:
    the hard mask includes $TaO_x$, where x is 2.5, and
    the ratio of the thickness of the hard mask to the thickness of the metal film is 1.1 or more.

4. The method as claimed in claim 1, further comprising:
    forming an alignment key including a same metal as the metal film below the metal film, wherein the forming the hard mask pattern includes:
    forming a photomask on the hard mask,
    forming a photomask pattern by exposing and developing the photomask, and detecting the alignment key using a light source having a wavelength of 500 nm to 700 nm before the exposing and developing,
    etching the hard mask using the photomask pattern as an etching mask, and
    removing the photomask pattern.

5. A method of fabricating a semiconductor device, the method comprising:
    forming a first interlayer insulating film and a first wiring embedded in the first interlayer insulating film, on a substrate;
    forming a metal film on the first interlayer insulating film and the first wiring;
    forming a first protective film on the metal film;
    forming a hard mask including at least one of $TaO_x$, where, x is 2.0 to 2.5, tungsten oxide, cobalt oxide, nickel oxide, platinum oxide, aluminum oxide, and titanium oxide on the first protective film;
    forming a hard mask pattern by patterning the hard mask, and the hard mask pattern being aligned to overlap the first wiring by using a light source having a wavelength of 500 nm to 700 nm; and
    forming a second wiring electrically coupled to the first wiring, by patterning the metal film using the hard mask pattern as an etching mask.

6. The method as claimed in claim 5, wherein:
    the metal film includes Cu,
    patterning the metal film includes sputter etching the metal film, and
    forming the hard mask includes forming the hard mask at an alignment thickness T or less, the alignment thickness T being expressed by the following formula:

$$T = \frac{\lambda}{2\pi k}, \qquad <\text{Formula}>$$

where symbol $\lambda$ is a wavelength of the light source, and symbol k is an extinction coefficient of the hard mask.

7. The method as claimed in claim 6, wherein:
    the hard mask includes $TaO_x$, where x is 2.5, and
    the ratio of the thickness of the hard mask to the thickness of the metal film is 1.1 or more.

8. The method as claimed in claim 5, further comprising forming a alignment key that is embedded in the first interlayer insulating film, and includes a same metal as the metal film,
    wherein forming the hard mask pattern includes aligning the hard mask pattern to overlap the first wiring by detecting the alignment key using the light source.

9. The method as claimed in claim 8, wherein the hard mask pattern extends in a same direction as the first wiring.

10. The method as claimed in claim 8, wherein the hard mask pattern extends in a direction that intersects the first wiring.

11. The method as claimed in claim 8, wherein the metal film and the alignment key include at least one of Cu, Pt, Co, and Ni.

12. The method as claimed in claim 5, further comprising:
    forming a second protective film on the first interlayer insulating film and the first wiring before forming the metal film;
    forming a second interlayer insulating film on the second protective film;
    forming a recess that at least partially exposes an upper surface of the first wiring by etching the second protective film and the second interlayer insulating film; and
    forming a via by filling the recess.

13. The method as claimed in claim 12, wherein the via is formed simultaneously with forming the metal film.

14. The method as claimed in claim 12, wherein the metal film and the via include at least one of Cu, Pt, Co, and Ni.

15. A method of fabricating a semiconductor device, the method comprising:
    providing a substrate having an alignment key including a metal formed therein;
    forming a metal film on the substrate and covering the alignment key, the metal film including a same metal as the alignment key;
    forming a protective film on the metal film;
    forming a hard mask on the protective film such that a ratio of a thickness of the hard mask to a thickness of the metal film is 1.0 or more, the hard mask including at least one of tantalum oxide, tungsten oxide, cobalt oxide, nickel oxide, platinum oxide, aluminum oxide, and titanium oxide, wherein a content of oxygen in the at least one of tantalum oxide, tungsten oxide, cobalt oxide, nickel oxide, platinum oxide, aluminum oxide, and titanium oxide is selected to provide an extinction coefficient value (k) of the hard mask such that the alignment key is detectable with a light source having a wavelength of 500 nm to 700 nm and such that a density ratio (d) of the hard mask with respect to the metal of the metal film is 1 or greater;

forming a photomask on the hard mask, detecting the alignment key using the light source having the wavelength of 500 nm to 700 nm, and patterning the photomask based on a detected position of the alignment key to form a photomask pattern;

etching the hard mask using the photomask pattern as an etching mask to form a hard mask pattern; and patterning the metal film, using the hard mask pattern as an etching mask.

16. The method as claimed in claim 15, wherein the metal of the metal film and alignment key includes copper (Cu).

17. The method as claimed in claim 15, further including:

removing the photomask pattern after etching the hard mask and before patterning the metal film, and after patterning the metal film, removing hard mask pattern debris generated in patterning the metal film.

18. The method as claimed in claim 15, wherein forming the hard mask includes forming the hard mask at an alignment thickness T or less, the alignment thickness T being expressed by the following formula:

$$T = \frac{\lambda}{2\pi k}, \qquad \text{<Formula>}$$

where symbol $\lambda$ is a wavelength of the light source, and symbol k is an extinction coefficient of the hard mask.

19. The method as claimed in claim 15, wherein the hard mask includes $TaO_x$, where x is 2.0 to 2.5.

* * * * *